(12) United States Patent
Cao et al.

(10) Patent No.: US 6,700,158 B1
(45) Date of Patent: Mar. 2, 2004

(54) TRENCH CORNER PROTECTION FOR TRENCH MOSFET

(75) Inventors: Densen B. Cao, Sandy, UT (US); Dean Probst, West Jordan, UT (US); Donald J. Roy, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/642,071

(22) Filed: Aug. 18, 2000

(51) Int. Cl.[7] ............... H01L 29/76; H01L 29/00
(52) U.S. Cl. ............ 257/330; 257/333; 257/401; 257/510; 257/512; 257/513
(58) Field of Search ................ 257/330, 333, 257/401, 510, 513, 512

(56) References Cited

U.S. PATENT DOCUMENTS

| 5,541,425 A | * | 7/1996 | Nishihara | 257/139 |
|---|---|---|---|---|
| 5,567,635 A | * | 10/1996 | Acovic et al. | 437/43 |
| 6,137,152 A | * | 10/2000 | Wu | 257/510 |
| 6,168,996 B1 | * | 1/2001 | Numazawa et al. | 438/270 |
| 6,188,104 B1 | * | 2/2001 | Choi et al. | 257/330 |
| 6,274,905 B1 | * | 8/2001 | Mo | 257/330 |

* cited by examiner

Primary Examiner—Jerome Jackson
Assistant Examiner—Joseph Nguyen
(74) Attorney, Agent, or Firm—Townsend and Townsend and Crew LLP

(57) ABSTRACT

A method of making a trench MOSFET structure having upper trench corner protection, the method not requiring trench corner rounding or sacrificial oxide/strip steps. The trench MOSFET structure fabricated according to the method of the present invention exhibits higher oxide breakdown voltage and lower gate-to-source capacitance.

9 Claims, 7 Drawing Sheets

TRENCH CORNER PROTECTION FOR TRENCH MOSFET

BACKGROUND OF THE INVENTION

The present invention relates in general to semiconductor technology, and in particular to forming trench DMOS (Double-Diffused Metal Oxide Semiconductor) field effect transistors having enhanced electrical characteristics.

Power field effect transistors (FETs), such as a Metal Oxide Semiconductor FET (or MOSFET), are well known in the semiconductor industry. One type of MOSFET is a double-diffused MOSFET (or DMOS transistor). DMOS transistors typically include: a substrate having a first conductivity type that acts as the drain; an epitaxial layer of the first conductivity type formed over the substrate; a gate electrode formed over the epitaxial layer; source regions of the first conductivity type positioned on opposite sides of the gate electrode; a well having a second conductivity type, which is opposite that of the first conductivity type; and a doped heavy body having the second conductivity type and positioned adjacent each source region on the opposite side of the source region from the gate electrode.

A variation of the DMOS transistor is the "trench" DMOS transistor. The gate of a trench DMOS transistor is defined by one or more trenches that extend vertically downward into an underlying epitaxial layer. Each trench is typically lined with a dielectric material and filled with conductive polysilicon. The source and drain junctions are doped with either n-type or p-type dopants. In either case, the heavy body and well are doped with the oppositely charged dopant type. For example, if the source is n-type, the heavy body and well are doped p-type.

One characteristic of the trench DMOS transistors is the sharp-edged corners that appear at the top and bottom of the trenches following formation of the trenches in both the active cell area and the gate bus area. In operation, high electric fields tend to converge towards these trench corners and, consequently, a lower breakdown voltage of the trench DMOS transistor is observed.

A number of methods have been proposed to round trench corners in order to avoid the low breakdown voltage problem. One method uses a rounding etch followed by a downstream plasma etch. An undesirable side effect of applying the rounding etch, however, is that it causes damages to the sidewalls of the trench and removal of field oxide from the termination structure. This surface damage to the trench sidewalls can contribute to an increase in charge density incorporated in the gate oxide layer formed later on the surface of the trench sidewalls. Removal of field oxide from the termination structure adversely affects device performance. Additionally, the trench rounding process is not totally effective in eliminating the sharp trench corners.

A common technique used to cure trench sidewall surface damage is to grow a sacrificial oxide over the trench sidewalls and then strip the sacrificial oxide. Application of this technique cures the trench sidewall surface damage. However, the sacrificial oxide/strip step increases the trench width, thereby preventing shrinkage of the trench cell.

Finally, in addition to the drawbacks described above, incorporation of the trench rounding and sacrificial oxide/strip step is undesirable since it add more processing steps in the overall trench DMOS transistor fabrication process.

SUMMARY OF THE INVENTION

Generally, the present invention provides a novel method of making a trench MOSFET structure having upper trench corner protection, whereby the need for trench corner rounding or sacrificial oxide/strip steps is obviated. The trench MOSFET structure fabricated according to the method of the present invention exhibits higher oxide breakdown voltage and lower gate-to-source capacitance while reducing the number of processing steps.

In a first aspect of the invention a novel trench MOSFET is disclosed, which provides enhanced upper trench corner protection. The trench MOSFET comprises a substrate over which a masking layer is selectively formed to define a plurality of trench opening accesses. A plurality of trenches are formed through the trench opening accesses and into the substrate. Each trench has a bottom, sidewalls and upper edges extending between end walls of the trench. A dielectric layer lines the bottom and sidewalls of each trench and extends up at least on trench end wall and over a predetermined area of the substrate. A conductive material layer lines the dielectric layer within each trench, the conductive material layer including an extension that extends up in a direction out of the trench and laterally over and above a portion of the predetermined area of the substrate. A portion of the masking layer is formed between the conductive material layer extension and the portion of the dielectric layer overlying the predetermined area of the substrate. Formation of this portion of the masking layer results in increased separation between corners of the trench at the end walls and the conductive material extension, which lies above the predetermined area of the substrate.

In a second aspect of the invention, a novel trench MOSFET is disclosed. The trench MOSFET comprises a substrate into which a trench is formed, the trench having a bottom, sidewalls and upper edges extending between end walls of the trench. A buffer layer lines the bottom and sidewalls of the trench and overlies a portion of the substrate. The buffer layer extends from a predetermined location away from the trench, to an upper edge of the trench end wall, and into the trench. A dielectric layer covers a portion of the buffer layer, including a predetermined portion of the predetermined portion of the buffer layer that extends from the location away from the trench to the upper edge of the trench end wall. Finally, a conductive material layer overlies a predetermined portion of the second dielectric layer and lines the buffer layer.

In a third aspect of the invention, a method of providing a trench MOSFET is disclosed. The first step in the method is to provide a substrate. A masking layer is then formed over the substrate, the masking layer defining a trench opening access. A trench is then formed through the trench opening access and into the substrate, the trench having a bottom, sidewalls and edges extending between end walls of the trench. Next, the bottom and sidewalls of the trench are lined with a dielectric layer. The dielectric layer is also formed to extend up the end wall of the trench and over a predetermined area of the substrate. Then the dielectric layer within the trench is lined with a conductive material layer. The conductive material layer includes an extension that extends up in a direction out of the trench and laterally over and above a portion of the predetermined area of the substrate. Finally, a portion of the masking layer is formed between the conductive material layer extension and the portion of the dielectric layer that overlies the predetermined area of the substrate. It should be emphasized that in this method, the steps are not necessarily listed in sequential order. For example, as described in the detailed specification, the field oxide portion of the dielectric layer is preferably formed first, followed by formation of the masking layer and the gate oxide portion of the dielectric layer.

A further understanding of the nature and advantages of the inventions herein may be realized by reference to the remaining portions of the specification and the attached drawings.

BRIEF DESCRIPTION OF THE DRAWINGS

FIGS. 2GG–2KK are side views of a rear portion of the cross-sectional views in FIGS. 2G–2K, respectively;

DESCRIPTION OF THE SPECIFIC EMBODIMENTS

The present invention provides a novel method of fabricating a trench DMOS field effect transistor that includes trench corner protection. The method does not incorporate the trench rounding and sacrificial oxide/strip steps used in the prior art, thereby eliminating at least eight processing steps. Additionally, the invention provides a trench DMOS transistor that exhibits enhanced operating characteristic compared to prior art devices. For example, a higher oxide breakdown voltage and a lower gate-to-source capacitance are observed in the device manufactured using the method of the present invention.

Figure 1:
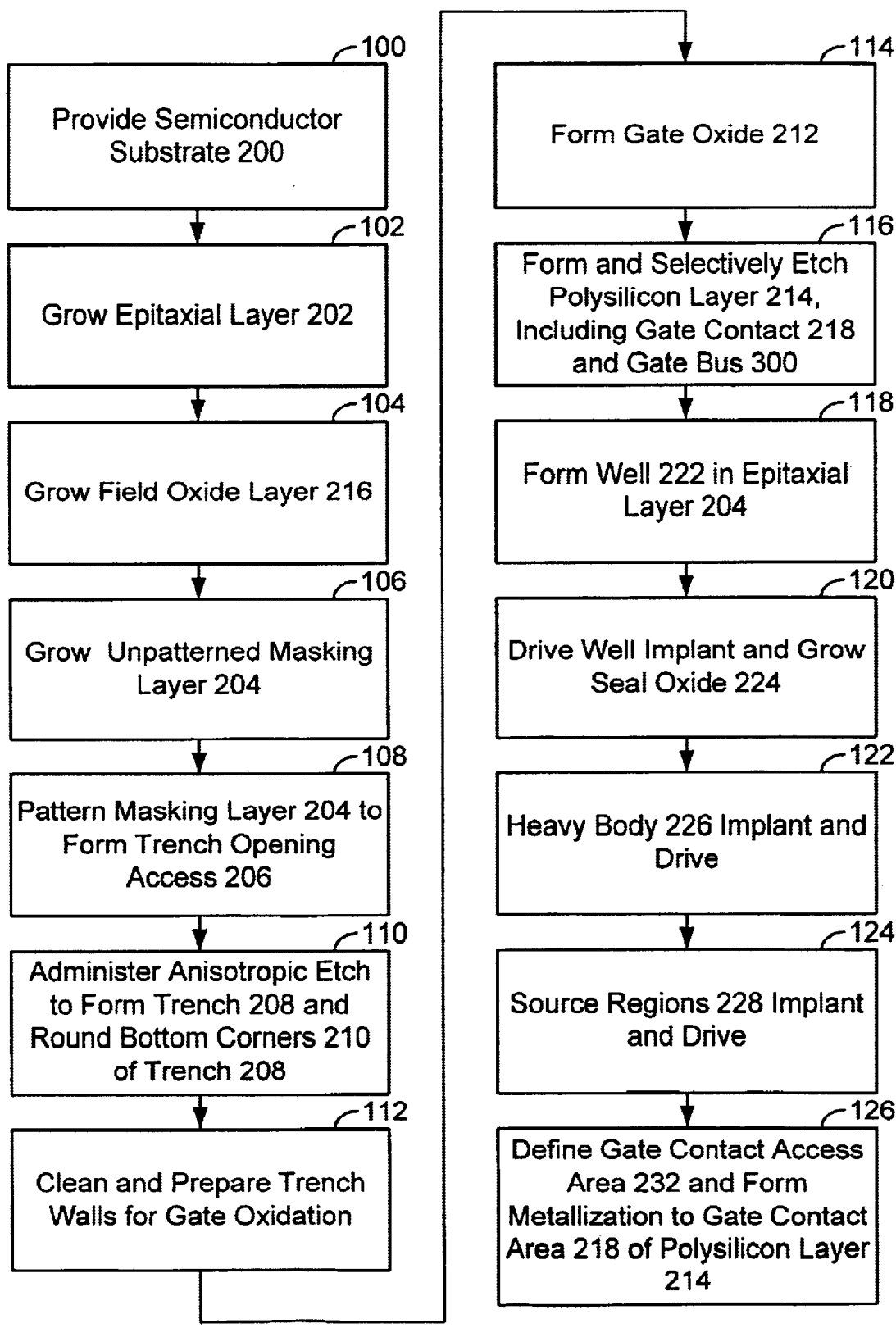
FIG. 1 is a simplified flow chart of an exemplary process according to the present invention.

Referring now to FIG. 1, there is shown a flow diagram illustrating an exemplary process flow for manufacturing a trench DMOS field effect transistor in accordance with the present invention. It should be understood that the following description of the steps of the process is only exemplary and that the scope of the invention should not be construed as being limited to this particular example. For example, processing conditions such as temperature, pressure, layer thicknesses, etc. could be possibly varied, without departing from the spirit of the invention.

Figure 2A:
FIGS. 2A–2K show front cross-sectional views of a front portion of a trench DMOS transistor fabricated according to the process of FIG. 1.
Figure 2B:
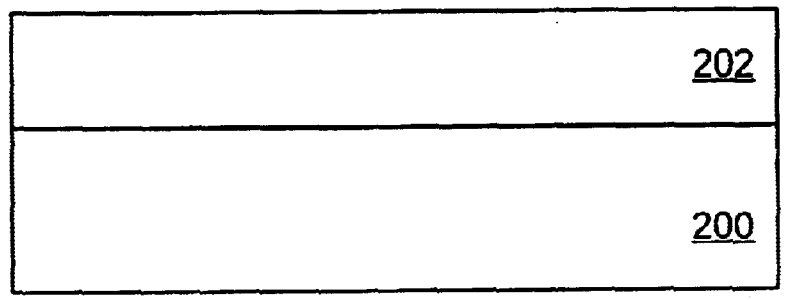
Figure 2C:
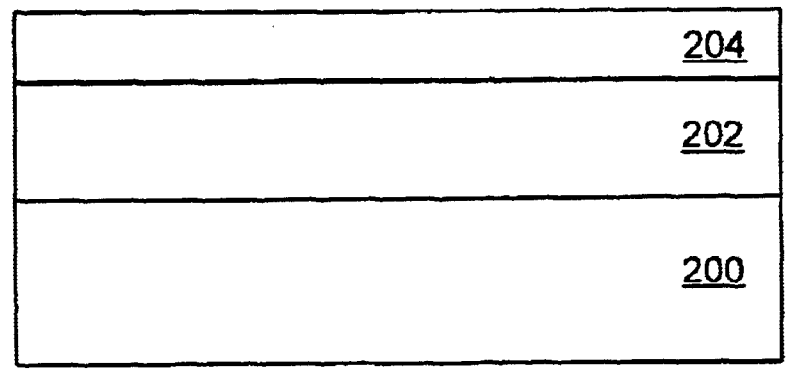
Figure 2D:
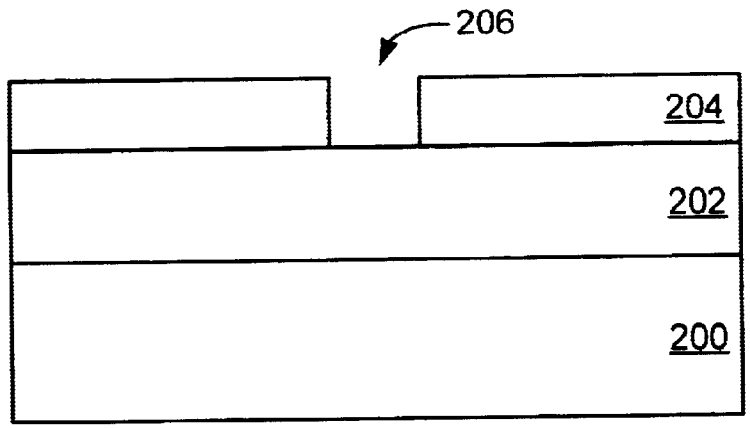
Figure 2E:
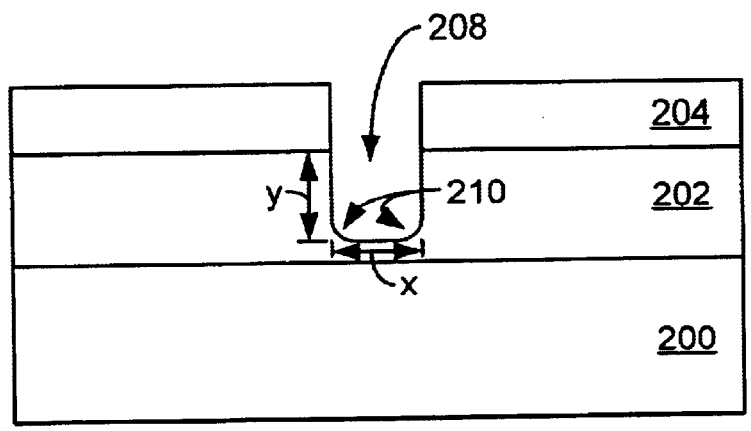
Figure 2F:
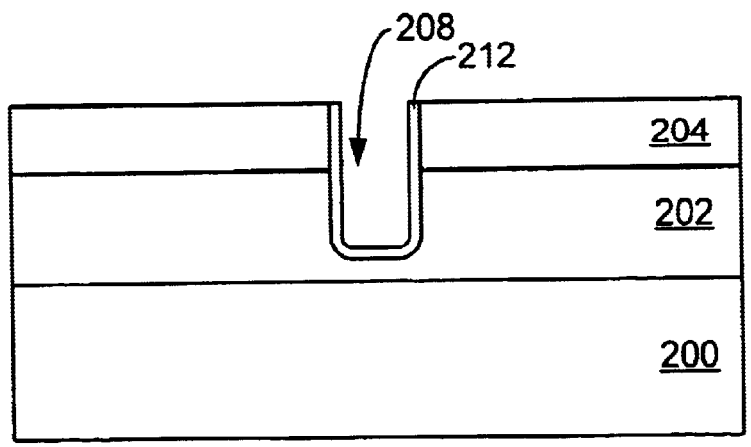
Figure 2G:
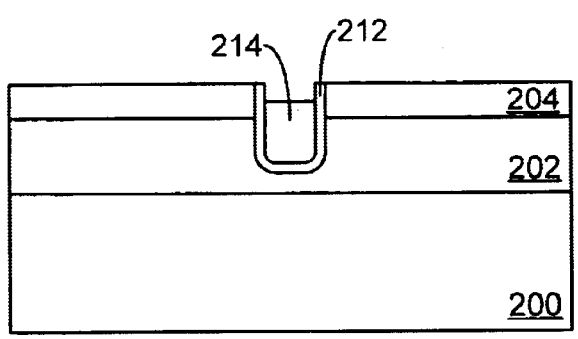
Figure 2G:
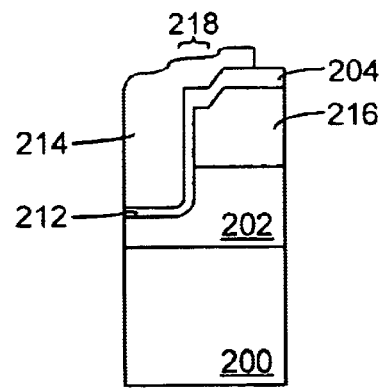
Figure 2H:
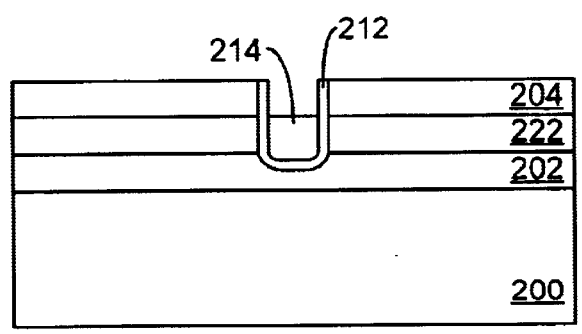
Figure 2H:
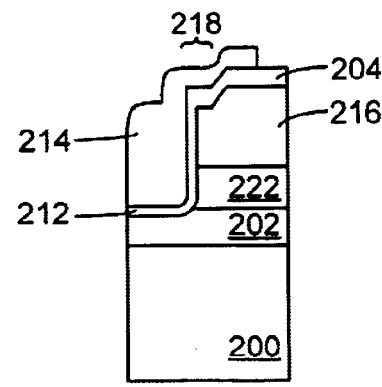
Figure 2I:
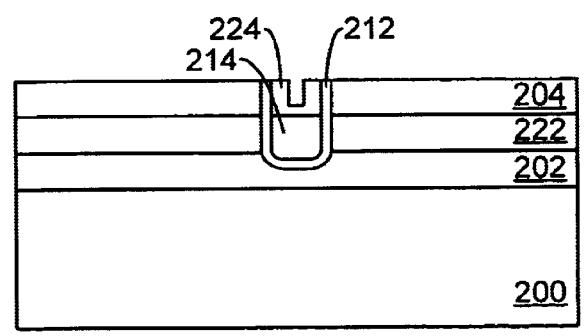
Figure 2I:
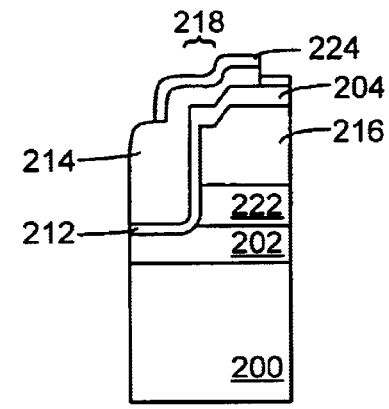
Figure 2J:
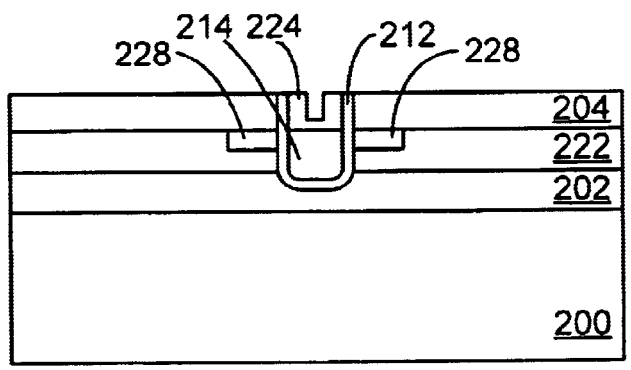
Figure 2J:
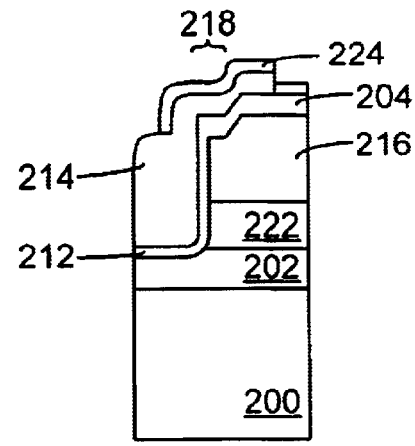
Figure 2K:
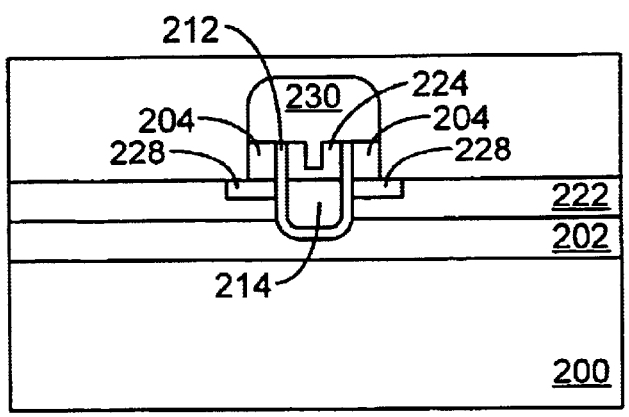
Figure 2K:
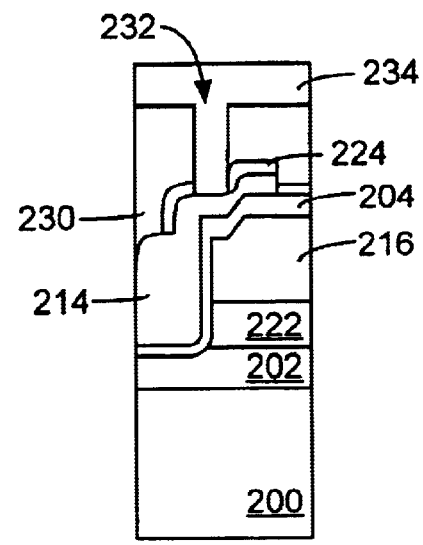

The process flow diagram of FIG. 1 is described here in connection with FIGS. 2A through 2K and FIGS. 2GG through FIGS. 2KK. Unless otherwise indicated, the process flow is described in terms of forming a single trench for a trench DMOS field effect transistor. However, one of skill in the art will understand that a multiplicity of trenches could all be formed simultaneously using substantially the same process flow. Also, it should be borne in mind that the relative dimensions of the various layers in the figures are not necessarily drawn to scale. So, some layers may be drawn thicker or thinner relative to other layers in order to highlight distinguishing features of the invention.

The first step 100, in the process flow of FIG. 1, is to provide a semiconductor substrate 200 as shown in FIG. 2A. In this exemplary embodiment, the substrate has a standard thickness of 500 $\mu$m, is n-type and has a resistivity range of about 0.003 to 0.007 $\Omega$-cm.

Next, in step 102, an epitaxial layer 202 is grown over substrate 200, as shown in FIG. 2B. In this exemplary embodiment, epitaxial layer 202 is of the same conduction type as substrate 200, is grown to a thickness range of about 4.5 to 7 $\mu$m and has a resistivity range of about 0.1 to 0.2 $\Omega$-cm.

In step 104, a field oxide layer, preferably having a thickness between about 5000 to 8000 Å, is grown and etched to define a gate bus and termination structure. For sake of visual simplicity, the field oxide layer is not shown immediately following step 104. Nevertheless, as will be described in greater detail later, the field oxide layer will preferably surround, at least in part, each trench DMOS cell on substrate 200.

In step 106, a masking layer 204 is formed over epitaxial layer 202 as shown in FIG. 2C. In this exemplary embodiment, the masking layer is a material made of silicon dioxide ($SiO_2$) having a thickness of between about 500 and 2000 Å. Other materials, e.g. $Si_3N_4$ may also be used.

In step 108, masking layer 204 is patterned using standard lithography and then selectively etched using, for example, a plasma etch to form a trench opening access 206. FIG. 2D shows the result of performing step 108.

In step 110, an anisotropic etch is administered to form a trench 208. An "anisotropic etch," as it is meant here, is an etch that etches substantially in one direction, in this case vertically downward into epitaxial layer 202. Typically, the anisotropic etch is administered in the form of a plasma, which is an almost neutral mixture of energetic molecules, ions and electrons that have been excited in a radio-frequency electric field. Different gases are used depending on the material to be etched. The principal consideration is that the reaction products be volatile. For etching silicon, the preferred reactants are $NF_3$, Hbr, $HeO_2$, the preferred pressure is 150 mTorr and the duration of the etch is approximately 235 seconds. Anisotropic etch step 110 provides the added benefit of rounding the bottom corners 210 of trench 208. In this exemplary embodiment, the depth, y, of trench 208 (See FIG. 2E) is about 1.5 $\mu$m and the width, x, of trench 208 is about 0.42 $\mu$m at approximately 0.25 $\mu$m deep into trench 208. The values of x and y can be varied depending on the etching tool capability and/or particular device applications.

After etch step 110 is completed, a thin layer of oxide forms on the sidewalls of trench 208. This thin oxide layer is removed, in step 112, using a buffered oxide etch (BOE) that has a buffering agent to hydroflouric acid ratio of, for example, 50:1. Using such a BOE solution, the etch time is within the range of about 15 to 50 seconds, depending on the thickness of thin oxide layer. Etch step 110 and BOE step 112 may leave some debris, e.g. Si, inside trench 208. This debris can be removed by administering a short Si etch, for example a plasma etch, for a time of less than approximately 15 seconds.

Next, in step 114, a gate oxide 212 is grown over the trench walls as is shown in FIG. 2F. In this exemplary embodiment, the gate oxide has a thickness from about 100 to 800 521 .

In step 116, a doped polysilicon layer 214 is formed to fill trench 208 to a predetermined depth. In this particular embodiment the thickness of polysilicon layer 214 is within the range of about 3,000 to 12,000 Å depending on the dimensions of trench 208 and final device performance requirements. It should be pointed out that, although doped polysilicon is the preferred material for layer 214, various other low resistivity materials can be used, for example, a silicide or the materials as described in detail in commonly-assigned patent application Ser. No. 09/343,330, entitled "Trench Structure Substantially Filled with High Conductivity Material," by Mo et al., which is hereby incorporated by reference in its entirety. If polysilicon is used to fill trench 208 to a point that covers a mesa formed between adjacent trenches, a polysilicon etch can be administered to remove the polysilicon from the top of the mesa. This etch process will leave a recessed polysilicon layer within trench 208. FIG. 2G shows a front cross-sectional view of substrate 200, epitaxial layer 202, masking layer 204, gate oxide layer 212, and polysilicon layer 214, following step 116.

As shown in FIG. 2GG, which is a side view of the rear of the cross-sectional view of FIG. 2G, polysilicon layer 214 also includes a polysilicon extension, which extends up and out of the rear of trench 208 and over field oxide layer 216 and underlying masking layer 204. This polysilicon extension comprises part of a gate bus 300, which connects the gates of a multiplicity of trenches together. (This is shown later in FIG. 3A.) Each trench has a gate contact area 218 that connects to the gate bus.

Together, field oxide layer 216 and masking layer 204 separate the upper corners of trench 208 from polysilicon layer 214. This separation helps to isolate the trench upper corners, so that in operation the electric fields in the vicinity of the upper trench corners are reduced. This results in a higher oxide breakdown voltage. And, as explained more fully below, it also provides for a lower gate-to-source capacitance and assists in reducing charge density build-up in gate oxide layer 212.

Next in the process, at step 118, a well 222 is formed in epitaxial layer 202 to a predetermined depth, as is shown in FIG. 2H. Well 222 has a dopant charge type that is opposite to that of epitaxial layer 202. Preferably, well 222 is formed by an implant and drive process. For example, if epitaxial layer 202 is n-type, well 222 is formed by first implanting, for example, boron and then driving the boron in to the predetermined depth to make a p-type well 222. Accordingly, in step 120, the well implant is driven in to its predetermined depth. Also during step 120, a thermal budget is provided to grow a seal oxide 224 over polysilicon layer 214 and upper corners of trench 208, as is shown in FIGS. 2I and 2II. Seal oxide has two functions. One is to eliminate sharp corners in polysilicon layer 214 to reduce high electric fields in the vicinity of gate oxide layer 212 and masking layer 204 when the device is in operation. The second is to further protect the upper corners of trench 208. In this exemplary embodiment the thickness of seal oxide 224 is within the range of about 500 to 1,000 521 .

Following the implant drive of step 120, a heavy body mask is formed to pattern a heavy body region between adjacent trenches 208 (not shown in FIG. 2). For a p+ heavy body region, boron can be used as the dopant. Preferably, the p+ heavy body region is formed by an implant and drive process, at a dose of, for example, $2.5 \times 10^{15}$ cm$^{-2}$ and an energy of, for example, 120 keV.

After formation of the heavy body, the heavy body mask is removed and a new mask is patterned to prepare for formation of source regions for the trench DMOS transistor. Thereafter, at step 124, source regions 228 are formed, preferably by implant and drive. Preferably, source region 228 are formed in two separate implant steps. In a first source implant step, an arsenic dopant species is used at a dose of, for example, $1 \times 10^{16}$ cm$^{-2}$ and at an energy of, for example, 120 keV. In a second implant step, a phosphorous dopant species is used at a dose of, for example, $5 \times 10^{15}$ cm$^{-2}$ and at an energy of, for example, 100 keV or at an energy sufficient enough to drive the dopant species through masking layer 204. FIG. 2J shows the position of the source regions after completion of step 124.

At step 126, a dielectric layer 230 is formed and selectively etched to define a gate contact access area 232 (See FIG. 2KK), which isolates gate contact area 218 for metallization 234. A similar process is used to isolate and provide metallization for source regions 228.

Figure 3A:
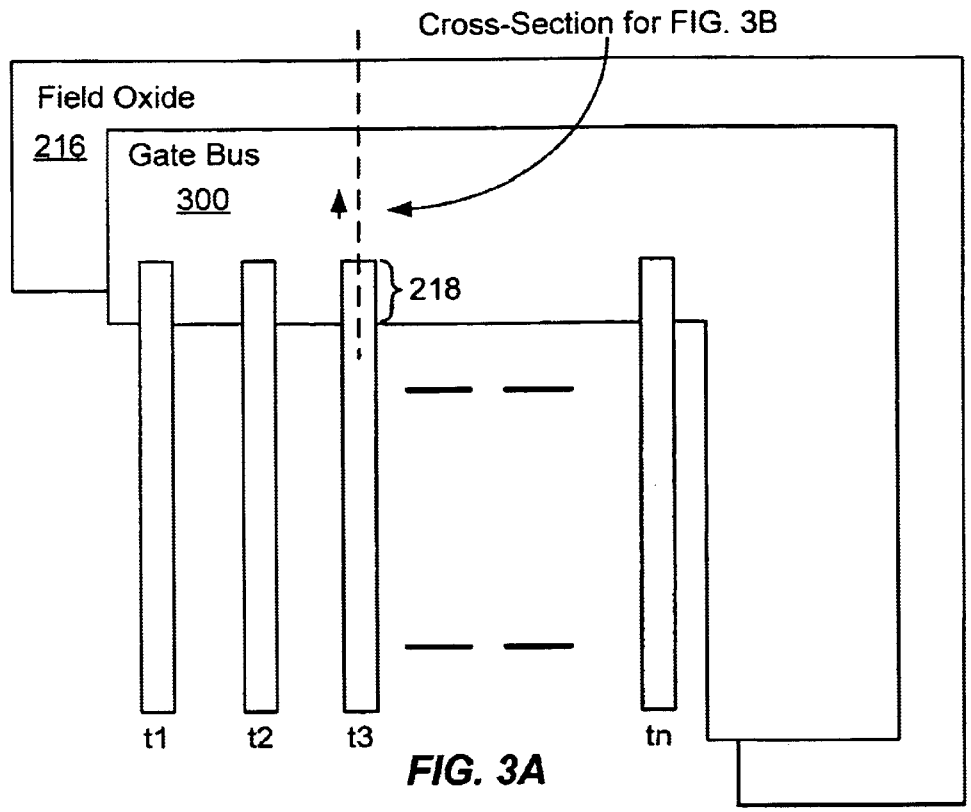
FIG. 3A is a plan view of a multiplicity of trenches, illustrating their relationship to a gate bus and a field oxide layer, according to an exemplary embodiment of the present invention.
Figure 4:
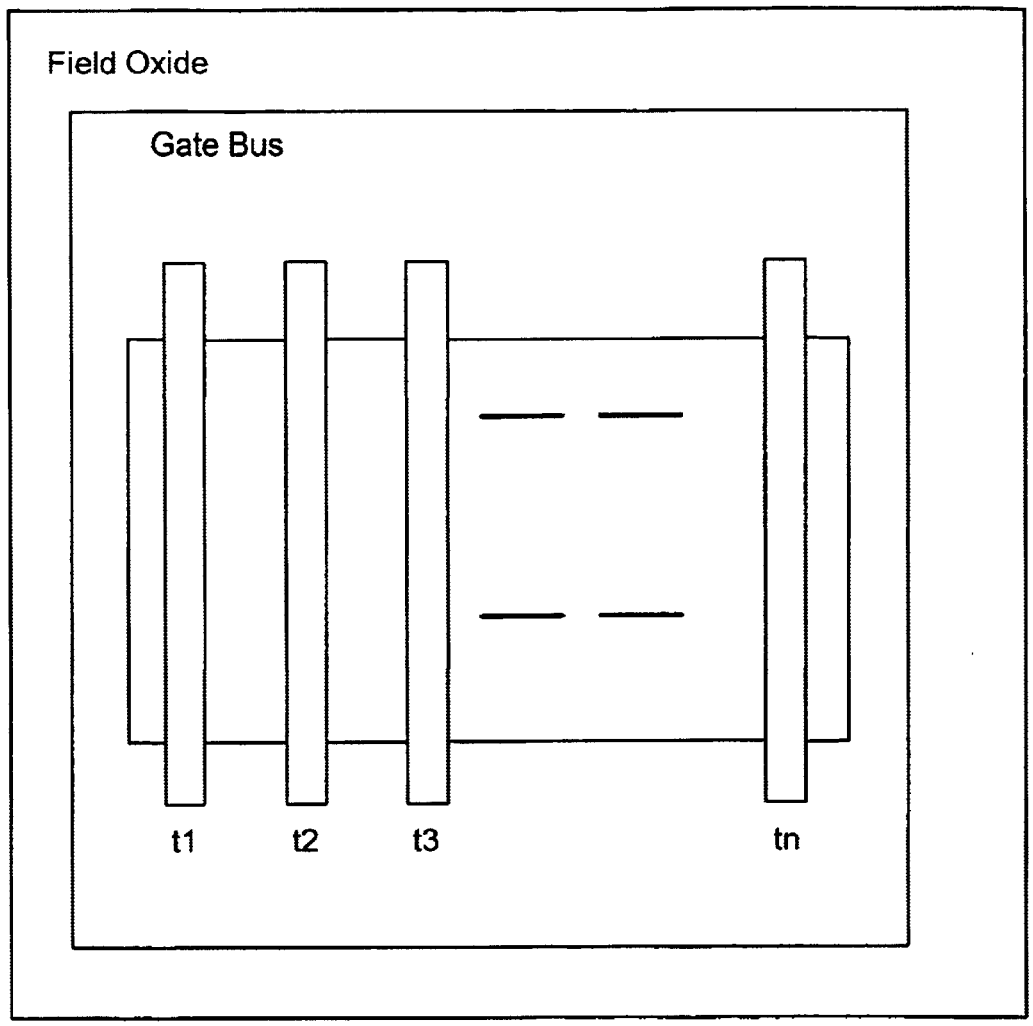
FIG. 4 is a plan view of a multiplicity of trenches, illustrating their relationship to a gate bus and a field oxide layer, according to another exemplary embodiment of the present invention.

As described above, gate bus 300 is used to electrically connect trench gates at gate contact areas 218 in the situation where a multiplicity of trenches 208 are formed using the method of the present invention. FIG. 3A is a plan view of a plurality of trenches 208 showing where the gate contact areas connect to gate bus 300. An alternative embodiment to that of FIG. 3A is shown in FIG. 4. There, contacts to the gate bus are formed on both ends of each trench.

Figure 3B:
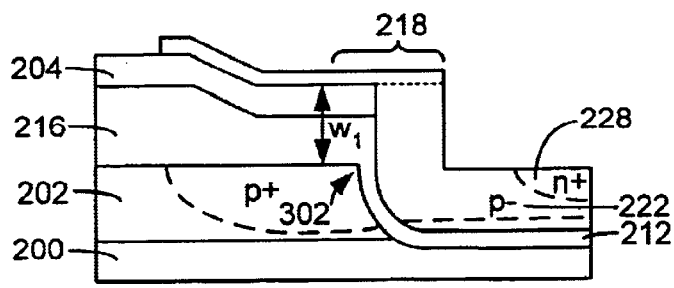
FIG. 3B is a cross-sectional view of the section shown in FIG. 3A.
Figure 3C:
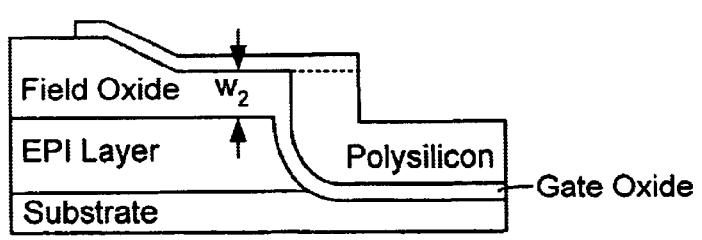
FIG. 3C is a partial cross sectional view of a prior art trench DMOS structure.

Referring now to FIG. 3B, there is shown a cross-section of the identified section in FIG. 3B, showing masking layer 204, field oxide layer 216, and polysilicon layer 214 (including gate contact area 218). FIG. 3C is a rear cross-sectional view of a trench, a field oxide layer, and a polysilicon layer of the prior art.

Notice that the prior art cross-section of FIG. 3C does not include a masking layer 204 to increase the separation of the upper trench corners 302 from the gate bus 300. In other words, comparing FIG. 3B to FIG. 3C, it is seen that $W_1 > W_2$. Because $W_1 > W_2$, the oxide breakdown voltage is higher for the structure shown in FIG. 3B than it is for the structure shown in FIG. 3C. Additionally, the structure in FIG. 3B has a lower gate-tosource capacitance than the structure in FIG. 3C. This is true, since the p+ heavy body and n+ source regions 228 are shorted together along metal contacts (not shown in the figures) and the p+ heavy body region lies partially under the region where the dielectric width equals $W_1$. It should be noted that the thicknesses and of the various layers in FIGS. 3B and 3C are not necessarily drawn to scale but are drawn to highlight the characteristic that $W_1 > W_2$.

In summary, a novel trench MOSFET fabrication process is disclosed. The method forms a portion of a trench masking layer over a field oxide region at one or more ends of the trench to increase the separation of upper corners of the trench from the overlying conductive material layer (e.g. doped polysilicon layer). The combined layers increase the thickness of the dielectric layer between the conductive material and the upper corners of the trench near the end walls of the trench, leading to a trench MOSFET having a reduced oxide breakdown voltage and a lower gate-to-source capacitance.

What is claimed is:

1. A trench MOSFET, comprising:

a substrate;

a plurality of trenches formed into the substrate, each trench having a bottom, sidewalls, endwalls and edges at the surface of the substrate;

a dielectric masking layer surrounding and defining the edges of each trench;

a field oxide layer surrounding the trench MOSFET and having portions that extend between the masking layer and the substrate to the edges of the endwalls of each trench;

a gate oxide layer lining the bottom, sidewalls and endwalls of each trench, the gate oxide extending out of each trench so that it abuts sides of the field oxide and masking layers, which border the edges of the trench endwalls; and a conductive material layer overlying above a predetermined portion of the masking layer and lining the gate oxide layer of each trench.

2. The trench MOSFET of claim 1, wherein the dielectric masking layer comprises an oxide.

3. The trench MOSFET of claim 1, wherein the conductive material layer is selected from a member of the group consisting of doped polysilicon, silicide and metal.

4. The trench MOSFET of claim 1, wherein the conductive material layer of each trench is electrically coupled to a gate bus region.

5. A trench MOSFET, comprising:

a substrate;

a trench formed in the substrate, the trench having a bottom, sidewalls, endwalls and edges at the surface of the substrate;

a dielectric masking layer surrounding and defining the edges of the trench;

a field oxide layer surrounding the trench MOSFET and having portions that extend between the masking layer and the substrate to the edges of the endwalls of the trench;

a gate oxide layer lining the bottom, sidewalls and endwalls of the trench and extending out of the trench so that it abuts sides of the field oxide and masking layers bordering the edges of the trench endwalls; and a conductive material layer overlying above a predetermined portion of the masking layer and lining the gate oxide layer.

6. The trench MOSFET of claim 5, wherein the conductive material layer is selected from a member of the group consisting of doped polysilicon, silicide and metal.

7. A trench MOSFET, comprising:

a substrate;

a trench in the substrate;

a gate dielectric layer lining the bottom, sidewalls, and endwalls of the trench;

a field oxide layer having a portion extending over a portion of the substrate adjacent to the trench;

a dielectric masking layer extending over the portion of the field oxide layer; and a conductive material layer lining the gate dielectric layer and extending out of the trench so as to overly above the dielectric masking layer and the field oxide layer.

8. The trench MOSFET of claim 7 wherein a corner of the conductive material layer where it extends out of the trench and over the dielectric masking layer and the field oxide layer is separated from a corner of the substrate adjacent to the trench at least by the dielectric masking layer and the field oxide layer.

9. The trench MOSFET of claim 7, wherein the conductive material layer is electrically coupled to a gate bus.

* * * * *